United States Patent [19]

Cicala

[11] 4,133,214
[45] Jan. 9, 1979

[54] KEYBOARD FOR PRESETTING THE TUNING OF A RADIO RECEIVING APPARATUS

[75] Inventor: Dario Cicala, Turin, Italy

[73] Assignee: Seas di Grissino & C.S.a.S., Turin, Italy

[21] Appl. No.: 797,956

[22] Filed: May 18, 1977

[30] Foreign Application Priority Data

May 24, 1976 [IT] Italy .............................. 68266 A/76

[51] Int. Cl.² ............................................ F16H 35/18
[52] U.S. Cl. .................................. 74/10.31; 74/10.33; 74/10.35; 74/10.37
[58] Field of Search .................. 74/10.33, 10.35, 10.37, 74/10.31; 334/7

[56] References Cited

U.S. PATENT DOCUMENTS

| 2,213,849 | 9/1940 | Robb | 74/10.33 |
| 2,217,066 | 10/1940 | Manning | 74/10.33 |
| 2,253,433 | 8/1941 | Kellogg | 74/10.37 |
| 2,424,845 | 7/1947 | Plensler | 74/10.33 |
| 3,247,728 | 4/1966 | Wolf | 74/10.33 |
| 3,412,619 | 11/1968 | Pelletier | 74/10.33 |
| 3,602,051 | 8/1971 | Olah | 74/10.35 |
| 3,863,509 | 2/1975 | Zimatone | 74/10.35 |
| 3,943,779 | 3/1976 | Ganderton | 74/10.33 |

FOREIGN PATENT DOCUMENTS 58428 4/1939 Denmark ................................. 74/10.33

Primary Examiner—Benjamin W. Wyche
Assistant Examiner—R. C. Turner
Attorney, Agent, or Firm—Sughrue, Rothwell, Mion, Zinn and Macpeak

[57] ABSTRACT

A keyboard for presetting tuning of a radio receiving apparatus, comprising a tuning setting member manually operable for setting up the tuning for the reception of a plurality of transmitters, and a group of depressible keys each one associated with a tuning storing element for cooperating with said member in such a manner that in a first condition of the key said element is conditioned to store the tuning preset by said member and in a second condition of the key the element automatically sets up said member according to the stored tuning, wherein said element includes a wedge pivotally mounted with respect to the associated key, said member being provided, in correspondence with each one of said elements, with a pair of converging profiles adapted to cooperate directly with the associated wedge.

15 Claims, 7 Drawing Figures

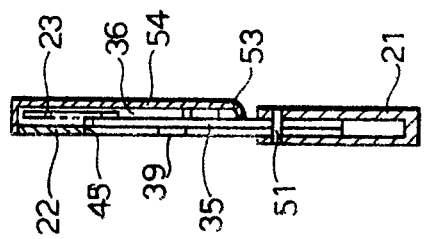
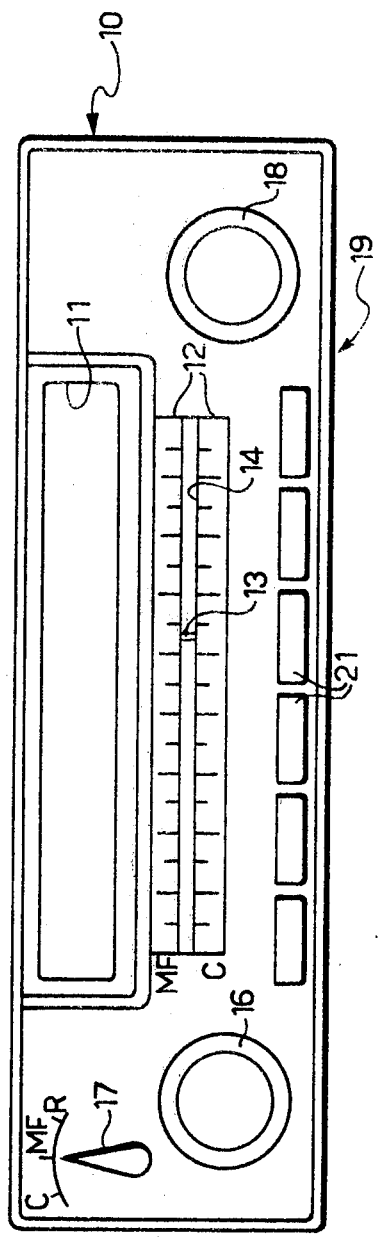
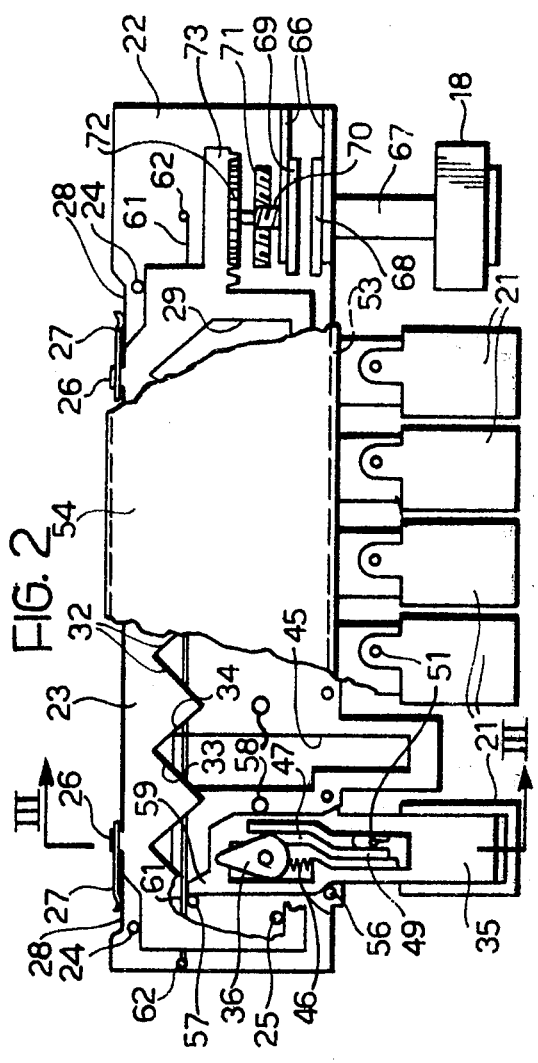

KEYBOARD FOR PRESETTING THE TUNING OF A RADIO RECEIVING APPARATUS

This invention relates to a keyboard for presetting the tuning of a radio receiving apparatus, comprising a tuning setting member manually operable for setting up the tuning for the reception of a plurality of transmitters and a group of depressible keys. More particularly, the invention relates to a keyboard for a radio receiving apparatus to be mounted on an motor-car, known as autoradio, wherein each key is associated with a tuning storing element adapted to cooperate with the setting member in such a manner that in a first condition of the key said element is conditioned to store the tuning preset by said member and in a second condition of the key the element automatically sets up said member according to the stored tuning.

A modern autoradio must have very reduced sizes, to be housed in the small space provided for it on the dashboard of the motor-cars. While it has been possible to reduce the sizes of the electronic apparatus, due to the use of the modern electronic semiconductors and printed or integrated circuits, it is always very important to reduce the space reserved to the mechanical control members, particularly in the case the autoradio is compounded with a sound recording and/or reproducing apparatus using the conventional magnetic tape cassettes.

The main object of the invention is to provide a keyboard for a radio receiving apparatus, wherein the tuning setting member cooperates directly with the tuning storing element, whereby the tuning is memorized with a very high precision, while requiring a reduced space. To this end, according to the invention, each tuning storing element includes a wedge pivotally mounted with respect to the associated key, the tuning setting member being provided, in correspondence with each one of said elements, with a pair of converging tapered profiles adapted to cooperate directly with the associated wedge.

According to another feature of the invention, the setting member is formed of a slide slidably movable in a direction substantially perpendicular to the direction of movement of the keys, each of said pairs of profiles being formed of the edges of a V-shaped notch of the slide.

According to another feature of the invention, the wedge is secured to a pivot shiftably mounted with respect to the associated key in a direction substantially parallel to the displacement of the key, spring means being provided for urging the pivot to cause the wedge to remove the clearance with respect to said profiles.

It is thus evident that the space required by the keyboard is strongly reduced, since it must include only the thickness of the key stem and of the wedge, whereas the precision of the tuning set up is secured by the wedge engaging the relevant notch under the urge of the spring means without any clearance.

The following description of a preferred embodiment of the invention, is made by way of example but not in a limiting sense, in conjunction with enclosed drawings, wherein:

FIG. 1 is a front view of a radio receiving apparatus integrated with a magnetic sound recorder and embodying a keyboard for presetting the tuning according to the invention;

FIG. 2 is a partial plan view of the keyboard of FIG. 1, where some parts have been removed;

FIG. 3 is sectional view taken along line III—III of FIG. 2;

Figure 4:
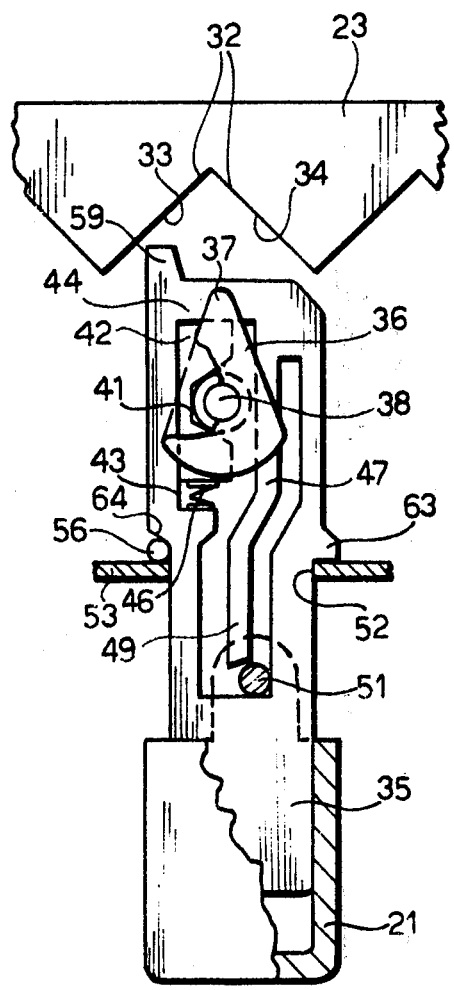
FIG. 4 is partial sectional view of one key in an enlarged scale, in a first operative condition.

With reference to FIG. 1, the numeral 10 generically indicates the control board of a radio receiving apparatus for motor-cars, known as autoradio, which incorporates an apparatus for reproducing the sound recorded on a magnetic tape. To this end the board 10 is provided with a rectangular aperture 11 for inserting the conventional magnetic tape cassette. The board 10 comprises also a scale 12 indicating the various ranges of tuning of the autoradio. A pointer 13 appearing throught a slot 14 on the scale 12 is transversely movable along the slot 14 to indicate the selected tuning.

The board 10 mounts a conventional knob 16 for switching on the apparatus and regulating the volume of the loud-speaker. The board 10 mounts also a lever 17 manually rotatable for setting up the band of tuning selected for the radio listening. The lever 17 may also be located in a position R, wherein it connects the conventional magnetic head of the sound reproducing apparatus to the amplifying circuit of the autoradio.

Furthermore, the board 10 mounts a knob 18 rotatable for manually setting up the tuning which will be more detailedly described later. Finally the board 10 mounts a keyboard generically indicated by the numeral 19, which comprises a group of keys 21 for storing and subsequently automatically setting up the tuning.

As it is known, the dash board of the motor-cars is provided with a room, normally closed by a removable plate, which is removed when the autoradio is mounted on the dashboard. The sizes of the room for the autoradio must comply with well defined national and international standards. For example the German standard DIN 75.500 requires for such a room, in the most limited form, a section of 180 × 44 mm. Since the known sound reproducing and/or recording apparatuses have a thickness of more than 30 mm, the importance of reducing the thickness of the keyboard is evident.

According to the invention, the keyboard 19 comprises a stationary plate 22 (FIG. 2), on which a tuning setting member is slidably mounted for movement in a direction perpendicular to the direction of movement of the keys 21.

More particularly, the setting member is formed of a tuning slide 23 guided rearwards by a set of pins 24 secured to the plate 22 and forwards by a pin 25 secured to the plate 22 as well.

The slide 23 is formed of a plate cut from a metal sheet and having a pair of projections 26, on which a pair of leaf springs 27 are secured. The leaf springs 27 cooperate with an edge 28 of the plate 22 for holding the slide 23 in contact with the pins 24 and for urging the edge 28 with a friction pressure capable of holding the slide 23 in the reached position.

The slide 23 is provided with a large aperture 29 having the rear edge provided with a group of V-shaped notches 32, each one associated with a corresponding key 21. The edges 33 and 34 of each notch 32 represent a pair of converging profiles adapted to directly cooperate with a tuning storing element carried by a stem 35 mounting an associated key 21, in the manner to be described later.

Figure 5:
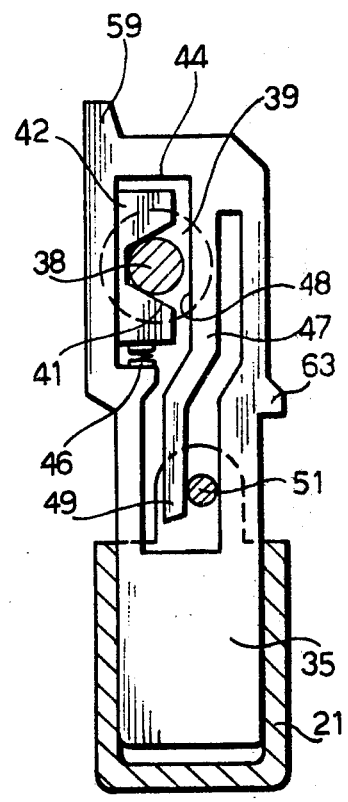
FIG. 5 is the key of FIG. 4 in a second operative condition.

Particularly, the storing element is formed as a wedge 36 having a rounded tip 37 (FIG. 4). The wedge 36 is secured to a pivot 38, in turn secured to a disk 39 (FIG. 5). The pivot 38 is housed in a substantially V-shaped notch 41 provided on a slide 42, which is slidably mounted on an edge 43 (FIG. 4) of the stem 35. The slide 42 is normally urged by a compression spring 46 to contact a second edge 44 of the stem 35.

The disk 39 is slidably guided in an aperture 45 (FIG. 2) of the plate 22.

The stem 35 of each key 21 (FIG. 4) is also cut from a metal sheet, and is provided with an integral elastic element formed of a cantilever tongue 47, elastically yieldable. An edge 48 of the tongue 47 normally slightly contacts the pivot 38, while the free end 49 of the tongue 47 is adapted to cooperate with a camming member or pin 51 secured to the corresponding key 21, for defining two different conditions of key 21 on the keyboard: a first condition for storing the tuning and a second condition for setting up the stored tuning.

More particularly, the key 21 is slidably mounted on the relevant stem 35 and can assume the extracted position shown in FIG. 4, where the pin 51 does not engage the end 49 of the tongue 47, whereby the pin 38 is free to rotate in the notch 41 of the slide 42. The key 21 can also assume the inserted position of FIG. 5, where the pin 51 engages the end 49 and forces the tongue 47 to lock with the edge 48 the pivot 38 into the notch 41, whereby the pivot 38 is locked on the stem 35 together with the wedge 36.

Each stem 35 is guided by three pins 56, 57 and 58 (FIG. 2) fixed on the stationary plate 22. The pin 58 is adapted to cooperate with an inclined edge of a projection 63 provided on the stem 35, in such a manner as to remove the clearance of the stem 35 with the pins 56 and 57 when the stem 35 is at the end of its rearward stroke.

The stem 35 is also provided with a projection 59 adapted to cooperate with a common yieldable member, formed of a leaf spring 61 secured at the two ends on a pair of pins 62 of the plate 22, for restoring each rearwards moved stem 35. Each stem 35 is provided with a shoulder 64 (FIG. 4) adapted to abut forwards against the pin 56.

Finally, secured to the plate 22 (FIG. 2) is a U-shaped support 66 rotatably mounting a rod 67, axially shiftable to assume two different axial positions on the support 66. Secured to one end of the rod 67 is the tuning set up knob 18. Secured to the other end of the rod 67 is a friction driving member 68 adapted to cooperate with a friction member 69, which is connected to the slide 23 through gear means comprising a pinion 70 secured to the member 69 and engaging a rack 73 secured to the slide 23. Therefore, by rotating the member 69, the slide 23 is transversely displaced. The slide 23 is also connected to the pointer 13 (FIG. 1) by known means adapted to transmit and multiply the motion. For instance such means may include wires and pulleys, capable of moving the pointer 13 through the entire slot 14, when the slide 23 (FIG. 2) is moved from one end to the other of its stroke. The keyboard is covered by a cover plate 54 (FIG. 2 and 3) having bent edges 53.

The described keyboard operates as follows.

It is firstly assumed that the tuning of a predetermined radio transmitting station is to be stored. Upon having switched on the autoradio by means of the knob 16 (FIG. 1), the knob 18 is depressed to axially shift the rod 67 (FIG. 2), thus causing the friction clutch 68-69 to connect the knob 18 with the slide 23. Now, by rotating the knob 18, the slide 23 is displaced till the desired radio transmitting station is exactly tuned. Now the key 21, on which the set up tuning is to be stored, is pulled up from the position of FIG. 5, so as to disengage the pin 51 from the end 49 of the tongue 47. The key 21 can be extracted since the shoulder 64 of the stem 35 is arrested by the pin 56 as shown in FIG. 4. The tongue 47 thus unlocks the pivot 38, whereby the wedge 36 is freely rotatable on the slide 42 which is urged by the spring 42 to contact the edge 44, whereby the previously stored tuning is zeroized or cleared.

Now the extracted key 21 is depressed, thus causing the pin 51 to engage the tapered front edge of the end 49, whereby the stem 35 is pushed rearwards ad displaced together with the slide 42 and the wedge 36. When the tip 37 of the wedge 36 engages the edges 33 or 34 of the notch 32, it is rocked from the present angular position to a new angular position corresponding to the position where the slide 23 has been set up.

During the final portion of the stroke of the stem 35, the wedge 36 is forced against the bottoms of the notch 32, thus compressing the spring 46 as shown in FIG. 5, whereby the slide 42 is slightly removed from the edge 44. It is thus made sure that the tip 37 of the wedge 36 contacts both edges 33 and 34 of the notch 32, whereby any possible clearance with the notch 32 is removed and the wedge 36 is angularly positioned with a very high precision. Furthermore, the stem 35 is forced with the tapered edge of the projection 63 against the pin 68 (FIG. 2), thus removing the clearance between the stem 35 and the pins 56 and 57.

Thereafter the key 21 is additionally depressed to cause the pin 51 to cam the tapered end 49 thus flexing the tongue 47 clockwise as shown in FIG. 5, whereby the key 21 is inserted again on the stem 35. The tongue 47 thus locks the pivot 38 and the wedge 36 in the reached angular position, whereby the tuning previously set up by the knob 18 (FIG. 2) remains exactly stored on the wedge 36. The key 21 may now be released, thus causing the spring 61 to restore the stem 35 together with the key 21, which remains in the inserted position with respect to the stem 35. The knob 18 is finally pulled up to disable the friction clutch 68, 69.

It is now assumed that the tuning, previously stored on the wedge 36 of one of the keys 21, is to be automatically set up. By depressing the key 21 from the position of FIG. 4, while the Knob 18 is in the pulled up position, the stem 35 causes the wedge 36 to engage the relevant notch 32, thus displacing transversely the slide 23 from any present position to a position corresponding to the angular position of the wedge 36. The positioning of the slide 36 is effected with a very high precision, since any clearance between the tip 37 of the wedge 36 and the edges 33 and 34 of the notch 32 is removed by the action of the spring 46 on the slide 42, and any clearance between the stem 35 and the pins 56 and 57 of the plate 22 (FIG. 2) is removed by the action of the projection 63 on the pin 58. When the key 21 is released, it is restored by the spring 61, while the slide 23 remains in the reached position, due to the friction of the leaf springs 27 on the edge 28 of the plate 22.

According to a modified embodiment of the invention, the key stem 35' (FIG. 6) is guided by two pins 56' and 58' fixed on the plate 22. The stem 35' in turn is provided with a pin 57' guided by a rectilinear profile 80 projecting from the plate 22. Slidably mounted on an edge 43' of an aperture 81 of the stem 35' is a slide 42' having a V-shaped notch 41' extending through a portion only of the thickness of the slide 42' and housing the pivot 38 of the wedge 36.

Provided at the end of the aperture 81 opposite to the key 21 is a rounded notch 82, rockably mounting a projection 83 of a lever 84, forming an elastic element for locking the pivot 38. The lever 84 is transversely guided by the plate 22 and a cross portion 86 integral with the stem 35' and raised or embossed therefrom. It should be evident that the cross portion 86 does not increase substantially the thickness of the keyboard, since the cross portion 86 is thinner than the wedge 36 and is embossed toward the same side thereof with respect to the stem 35'.

The slide 42' is provided with an edge 87 inclined 45 degrees with respect to the direction of movement of the key 21. In turn the lever 84 is provided with a shoulder 88 substantially parallel to the edge 87. Located between the edge 87 and the shoulder 88 is a compression spring 89, which on one hand urges the slide 42' toward an edge 90 of the aperture 81, on the other hand urges the free end 91 of the lever 84 to contact a shoulder 92 of a second aperture 93 of the stem 35'. The key 21 is provided with a slot 94 to avoid contacting the pin 56' at the depression of the key 21.

Figure 6:
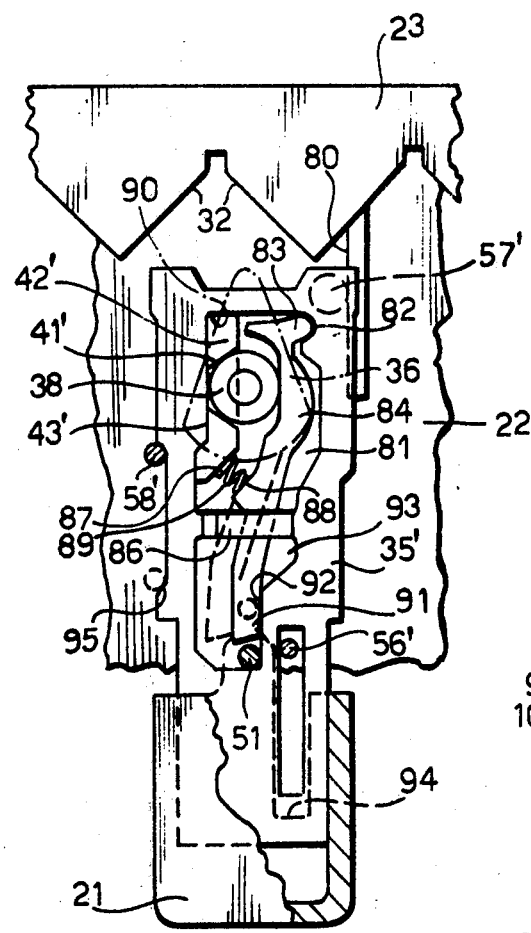
FIG. 6 is a first modified form of the key in the operative condition of FIG. 4.

When the key 21 is in the extracted position of FIG. 6, the lever 84 does not lock the pivot 38, whereby the wedge 36 can rotate freely on the slide 42'. To store a predetermined tuning, upon having set up the slide 23 as in the preceding case, the key 21 is depressed and causes the pin 51 to engage the end 91 of the lever 84.

The stem 35' is thus moved to engage the wedge 36 with the notch 32, whereby the wedge 36 is rocked selectively. At the end of the stroke of the stem 35' its tapered edge 95 engages the pin 58', thus removing any clearance of the stem 35' and the pin 57' with the pin 56' and the profile 80 respectively.

During the final part of the stroke of the stem 35' the spring 89 is compressed, whereby the slide 42' is removed from the edge 90 and the wedge 36 removes any clearance with respect to the notch 32 and is thus positioned with a very high precision. Then the key 21 is additionally depressed and is moved with respect to the stem 35'. The pin 51 engages the end 91 of the lever 84, which is thus rocked clockwise against the urge of the spring 89 to the position shown by broken lines in FIG. 6. The lever 84 locks now the pivot 38 and the wedge 36 in the reached angular position, thus storing the tuning preset on the slide 23.

The tuning stored on the wedge 36 can be automatically set up on the slide 23 in a manner similar to that of the embodiment of FIGS. 2-5.

To clear the wedge 36, the key 21 is pulled to disengage the pin 51 from the end 91 of the lever 84, which is thus rocked anticlockwise by the spring 89, while the slide 42' is urged thereby to contact the edge 90 of the stem 35'.

Figure 7:
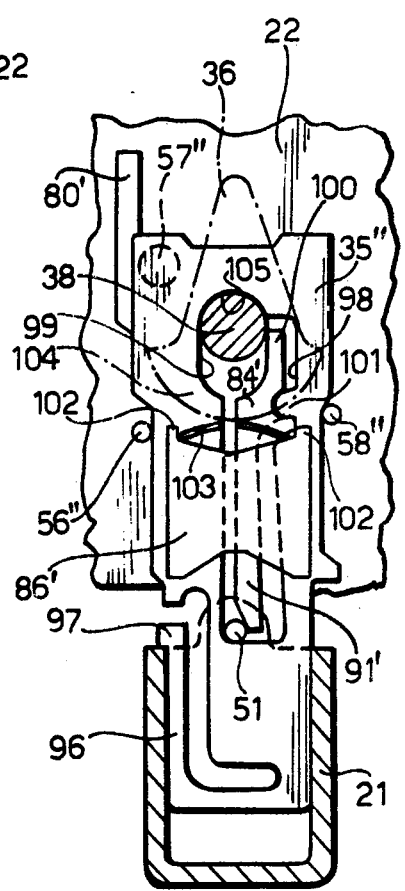
FIG. 7 is a second modified form of the key.

According the modified form of FIG. 7, the key 21 is forced on a stem 35", which includes an elastic element or tongue 96 integral with the stem 35". The tongue 96 is provided with an enlarged end projection 97 having the function of holding the key 21 in each of the two end positions. The stem 35" is also guided by means of two stationary pins 56" and 58" and a stationary edge 80' cooperating with a pin 57" of the stem 35", in a manner similar to the stem 35' of FIG. 6.

The stem 35" is provided with an aperture 98 having an edge 99, on which the pivot 38 of the wedge 36 can slide through a predetermined stroke, substantially in a direction parallel to the direction of the movement of the key 21. The pivot 38 can be locked by an arm 100 of a lever 84' rotatable on a rounded portion 101 of the stem 35". The cam end 91' of the lever 84' is adapted to cooperate with the pin 51 of the key 21.

Secured to the stem 35", for example by soldering, is a cross member 86', which forms with the aperture 98 an housing for the lever 84'. The member 86' is provided with a pair of shoulders 102, which are engaged by two ends of an arcuate leaf spring 103. The central portion of the spring 103 engages a circular edge 104 of the wedge, thus normally urging the pivot 38 to contact the bottom 105 of the aperture 98.

In FIG. 7 the key 21 is in a position corresponding to the zeroizing of the memorization of the wedge 36. By depressing the key 21, the stem 35" is displaced through the projection 97. When the wedge 36 engages the notch 32 of the slide 23, it is firstly selectively rocked and then presses the spring 103, whereby the pivot 38 is removed from the bottom 105.

By continuing the depression of the key 21 the elastic action of the tongue 96 is overcome, whereby the pin 51 engages the cam end 91' of the lever 84'. This latter is thus rocked clockwise, and locks the pivot 38 together with the wedge 36 in the reached angular position.

The restoring of the stem 35", the automatic setting up of the tuning on the slide 23 and the zeroizing of the tuning stored on the wedge 36 are effected in a manner similar to that described for the key 21 of FIG. 6.

It is intended that various other modifications, improvements and addition of parts may be made to the described keyboard without departing from the scope of the invention. For example, the single key restoring leaf spring 61 may be replaced by a plurality of separate key restoring springs. Furthermore, the slide 23 and/or the stems 35 and 35' may be made of plastic materials, rather than of metal. Finally, the described keyboard may be embodied on other apparatus requiring setting, storing and automatic resetting of a setting member.

What is claimed is:

1. A keyboard for presetting tuning of a radio receiving apparatus, comprising a tuning setting slide manually operable for setting up the tuning for the reception of a plurality of transmitters, and a group of depressible key means, the slide being slidably movable in a direction substantially perpendicular to the direction of movement of the key means, and each one of said key means being associated with a tuning storing element for cooperating with said slide in such a manner that in a first condition of the key means said tuning storing element is conditioned to store the tuning preset by said slide and in a second condition of the key means said tuning storing element automatically sets up said slide according to the stored tuning, wherein each of said tuning setting elements comprises a wedge which is pivotally mounted on the associated key means, said slide being provided, in correspondence with each one of said wedges, with a pair of converging profiles adapted to cooperate directly with the associated wedge when the key means is depressed, the key means having releasable locking means for releasing said wedge when said key means is in said first condition, thus allowing said wedge to reach an angular position as dictated by the converging profiles of the slide when the key means is depressed, and for locking said wedge against pivoting when said key means is in said second condition, whereby said slide is displaced by a camming action of said wedge on said converging profiles when the key means is depressed.

2. A keyboard as claimed in claim 1, wherein each of said pair of converging profiles are formed of the edges of a substantially V-shaped notch of the slide.

3. A keyboard as claimed in claim 1, wherein each key means comprises a stem and a key which is mounted on the stem and which is displaceable through a predetermined stroke with respect to the stem for defining said first and second conditions, wherein said wedge is pivotally mounted on said stem and wherein said releasable locking means comprise an elastic element which is carried by the stem and is conditionable for locking the associated wedge in the reached angular position in response to the displacement of the key with respect to the stem.

4. A keyboard as claimed in claim 3, wherein said stem is guided by a pair of aligned stationary guiding elements on one lateral side thereof and by a further stationary guiding element on another lateral side thereof, said further guiding element being sol located as to be engaged by a tapered edge of said stem at the end of the stroke of the latter to remove the clearance of the stem with said pair of aligned guiding elements.

5. A keyboard as claimed in claim 2, wherein the slide is formed of a slidable plate guided on a stationary plate and locked each time in the reached position by leaf springs frictionally operating between the slidable plate and said stationary plate.

6. A keyboard as claimed in claim 3, wherein said wedge is secured to a pivot shiftable with respect to said stem in a direction parallel to the direction of movement of the key, spring means being provided for urging said pivot to cause the wedge to remove the clearance with respect to said profiles.

7. A keyboard as claimed in claim 6, wherein said pivot is housed in a V-shaped notch of a sliding member and is contacted by said elastic element, and sliding member being slidable with respect to said stem against the urge of said spring means.

8. A keyboard as claimed in claim 6, wherein said pivot is slidable in a slot of said stem in a direction substantially parallel to the movement of the key.

9. A keyboard as claimed in claim 8, wherein said spring means include an arcuate leaf spring acting on a circular edge of said storing element opposite to said wedge.

10. A keyboard as claimed in claim 3, wherein each stem is a metallic plate and said elastic element is a yieldable tongue integral with said stem and having a free end engageable by a camming member secured on the associate key.

11. A keyboard as claimed in claim 3, wherein said elastic element is formed of a lever pivotally mounted on said stem and having a free end engageable by a camming member secured on the associated key for locking the associated wedge.

12. A keyboard as claimed in claim 7, wherein said spring means are located between said sliding member and said lever.

13. A keyboard as claimed in claim 3, wherein said stem includes an elastic element frictionally engaging said key, said predetermined stroke being effected upon overcoming said elastic element.

14. A keyboard as claimed in claim 3, wherein a common yieldable member is provided for restoring any stem displaced by the depression of the associated key.

15. A keyboard as claimed in claim 1, wherein said tuning setting member is normally set up by means of a manipulative rotatable knob, comprising a normally ineffective friction clutch located between said setting member and said knob, said knob being also depressible for rendering effective said friction clutch.

* * * * *